United States Patent
Hsieh

(10) Patent No.: US 9,036,437 B2
(45) Date of Patent: May 19, 2015

(54) METHOD AND APPARATUS FOR TESTING MEMORY UTILIZING A MAXIMUM WIDTH OF A STROBE SIGNAL AND A DATA WIDTH OF A DATA SIGNAL

(71) Applicant: Wistron Corporation, New Taipei (TW)

(72) Inventor: Min-Hua Hsieh, New Taipei (TW)

(73) Assignee: Wistron Corporation, New Taipei (TW)

( * ) Notice: Subject to any disclaimer, the term of this patent is extended or adjusted under 35 U.S.C. 154(b) by 8 days.

(21) Appl. No.: 14/150,783

(22) Filed: Jan. 9, 2014

(65) Prior Publication Data

US 2015/0092506 A1    Apr. 2, 2015

(30) Foreign Application Priority Data

Oct. 1, 2013 (TW) .............................. 102135525 A

(51) Int. Cl.
*G11C 29/00* (2006.01)
*G11C 29/04* (2006.01)

(52) U.S. Cl.
CPC ..................................... *G11C 29/04* (2013.01)

(58) Field of Classification Search
CPC .............................. G11C 29/04; G11C 2029/04
USPC .................. 365/201, 233.11, 233.13, 233.17, 365/233.19, 193, 189.07, 51, 63; 714/721, 714/718
See application file for complete search history.

(56) References Cited

U.S. PATENT DOCUMENTS

| | | | | |
|---|---|---|---|---|
| 5,159,679 A | * | 10/1992 | Culley | 710/59 |
| 5,179,534 A | * | 1/1993 | Pierce et al. | 365/189.15 |
| 2012/0327726 A1 | * | 12/2012 | Tsern et al. | 365/189.11 |
| 2014/0269117 A1 | * | 9/2014 | Maryan et al. | 365/193 |

* cited by examiner

*Primary Examiner* — Andrew Q Tran
(74) *Attorney, Agent, or Firm* — Jianq Chyun IP Office

(57) ABSTRACT

A method and an apparatus for testing a memory are provided, and the method is adapted for an electronic apparatus to test the memory. In the method, a left edge and a right edge of a first waveform of a clock signal for testing the memory are scanned to obtain a maximum width between two cross points of the left edge and the right edge. A central reference voltage of a data signal outputted by the memory is obtained, and a data width between two cross points of the central reference voltage and a left edge and a right edge of a second waveform of the data signal is obtained. Whether a difference between the data width and the maximum width is greater than a threshold is determined; if the difference is greater than the threshold, the memory is determined to be damaged.

12 Claims, 3 Drawing Sheets

METHOD AND APPARATUS FOR TESTING MEMORY UTILIZING A MAXIMUM WIDTH OF A STROBE SIGNAL AND A DATA WIDTH OF A DATA SIGNAL

CROSS-REFERENCE TO RELATED APPLICATION

This application claims the priority benefit of Taiwan application serial no. 102135525, filed on Oct. 1, 2013. The entirety of the above-mentioned patent application is hereby incorporated by reference herein and made a part of this specification.

BACKGROUND OF THE INVENTION

1. Field of the Invention

The invention relates to a testing method and a testing apparatus; more particularly, the invention relates to a method and an apparatus for testing a memory.

2. Description of Related Art

A double data rate (DDR) is a revolutionary memory technique based on synchronous dynamic random access memory (SDRAM) and is characterized by great performance and low costs. In the DDR SDRAM, data are transferred on both the rising and falling edges of a clock signal; compared to the conventional SDRAM in which data are transferred only on the rising edge of the clock signal, the access speed of the DDR SDRAM may be twice the access speed of the SDRAM. Additionally, the DDR SDRAM has low power consumption in comparison with the conventional SDRAM.

The DDR SDRAMs are mainly applied to products including personal computers and servers and are often in form of dual in-line memory modules (DIMMs) so as to be inserted into the memory slots of the motherboards of the computers. To reduce the space and relevant costs, the memory has been directly soldered to the motherboard of the personal computer (i.e., the on-board memory). Nevertheless, in the event that the on-board memory is damaged, the defective memory die cannot be determined according to the related art, and thus all the memory dies need be replaced through hardware means. This often leads to the necessity of discarding the entire motherboard.

SUMMARY OF THE INVENTION

The invention is directed to a method and an apparatus for testing a memory, through which whether the memory is damaged can be determined during the initialization of the memory.

In an embodiment of the invention, a method for testing a memory is provided, and the method is adapted for an electronic apparatus to test the memory. In the method, a left edge and a right edge of a first waveform of a clock signal (DQS) for testing the memory are scanned to obtain a maximum width between two cross points of the left edge and the right edge. A central reference voltage of a data signal (DQ) outputted by the memory is obtained, and a data width between two cross points of the central reference voltage and a left edge and a right edge of a second waveform of the data signal is obtained. Whether a difference between the data width and the maximum width is greater than a threshold is determined; if the difference is greater than the threshold, the memory is determined to be damaged.

According to an embodiment of the invention, the clock signal includes two differential signals, and the step of scanning the left edge and the right edge of the first waveform of the clock signal for testing the memory to obtain the maximum width between the two cross points of the left edge and the right edge of the first waveform of the clock signal includes: scanning the cross points of the left edges of the two differential signals and the cross points of the right edges of the two differential signals to obtain the maximum width between the two cross points of the left edge and the right edge of the first waveform of the clock signal.

According to an embodiment of the invention, the step of determining whether the difference between the data width and the maximum width is greater than the threshold further includes: determining whether the data width is greater than the maximum width; if the data width is greater than the maximum width, the difference between the data width and the maximum width is compared with the threshold, so as to determine whether the difference is greater than the threshold; if the data width is less than the maximum width, an absolute value of the difference between the data width and the maximum width is calculated and compared with the threshold, so as to determine whether the absolute value of the difference is greater than the threshold.

According to an embodiment of the invention, the method is adapted to be conducted when a basic input output system (BIOS) of the electronic apparatus initializes the memory.

According to an embodiment of the invention, the steps of obtaining the data width between the two cross points of the central reference voltage and the left edge and the right edge of the second waveform of the data signal and determining whether the difference between the data width and the maximum width is greater than the threshold to determine whether the memory is damaged include: sequentially obtaining the data width between the two cross points of the central reference voltage and the left edge and the right edge of the second waveform of the data signal outputted by each of a plurality of memory dies in the memory; determining whether the difference between each of the data widths and the maximum width is greater than the threshold; if the difference is greater than the threshold, the corresponding memory die is determined to be damaged.

In an embodiment of the invention, an apparatus for testing a memory is provided, and the apparatus includes a clock generator, a waveform scanner, a data analyzer, and a comparator. The clock generator is coupled to the memory so as to generate a clock signal (DQS) for testing the memory and output the clock signal to the memory. The waveform scanner is coupled to the clock generator and is configured to scan a left edge and a right edge of a first waveform of the clock signal to obtain a maximum width between two cross points of the left edge and the right edge. The data analyzer is coupled to the memory and is configured to obtain a central reference voltage of a data signal (DQ) outputted by the memory and obtain a data width between two cross points of the central reference voltage and a left edge and a right edge of a second waveform of the data signal. The comparator is coupled to the waveform generator and the data analyzer and is configured to determine whether a difference between the data width and the maximum width is greater than a threshold and determine that the memory is damaged if the difference is greater than the threshold.

According to an embodiment of the invention, the clock signal includes two differential signals, and the waveform scanner scans the cross point of the left edges of the two differential signals and the cross point of the right edges of the two differential signals to obtain the maximum width between the two cross points of the left edge and the right edge of the first waveform of the clock signal.

According to an embodiment of the invention, the comparator further determines whether the data width is greater than the maximum width; if the data width is greater than the maximum width, the comparator compares the difference between the data width and the maximum width with the threshold to determine whether the difference is greater than the threshold, and if the data width is less than the maximum width, the comparator calculates an absolute value of the difference between the data width and the maximum width and compares the absolute value with the threshold to determine whether the absolute value of the difference is greater than the threshold.

According to an embodiment of the invention, the apparatus tests the memory when a BIOS of the electronic apparatus having the memory initializes the memory.

According to an embodiment of the invention, the clock generator and the data analyzer are respectively coupled to a plurality of memory dies of the memory, and the clock generator outputs the clock signal to each of the memory dies. The data analyzer sequentially obtains the data width between the two cross points of the central reference voltage and the left edge and the right edge of the second waveform of the data signal outputted by each of the memory dies in the memory. The comparator determines whether the difference between each of the data widths obtained by the data analyzer and the maximum width is greater than the threshold and determines that the corresponding memory die is damaged if the difference is greater than the threshold.

According to an embodiment of the invention, the threshold is positive or negative skew between the clock signal and the data signal or a multiple of the positive or negative skew.

As provided above, in the method and the apparatus for testing the memory, the waveform of the clock signal is scanned to obtain the maximum width of the valid data window, and the maximum width is compared with the width of the data signal outputted by the memory. If the width of the data signal exceeds the maximum width of the valid data window, the memory is determined to be damaged. Different memory dies in the memory may be further tested by conducting the method described herein, so as to locate and replace the damaged memory die; thereby, the rate of discarding the motherboard with the on-board memory may be reduced.

Several exemplary embodiments accompanied with figures are described in detail below to further describe the invention in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EMBODIMENTS

The clock signal of DDR is a differential signal that includes DQS and /DQS signals, and the cross points of the differential signal serves as the reference clock of the DQ signal. The cross points of two edges of the differential signal defines the width of the valid data window. In another aspect, if each of the DQS signal and the DQ signal has a slope, a limited skew may exist between the start point of the DQS signal and the start point of the DQ signal, and the limited skew is referred to as DQ-DQS skew.

Figure 1:
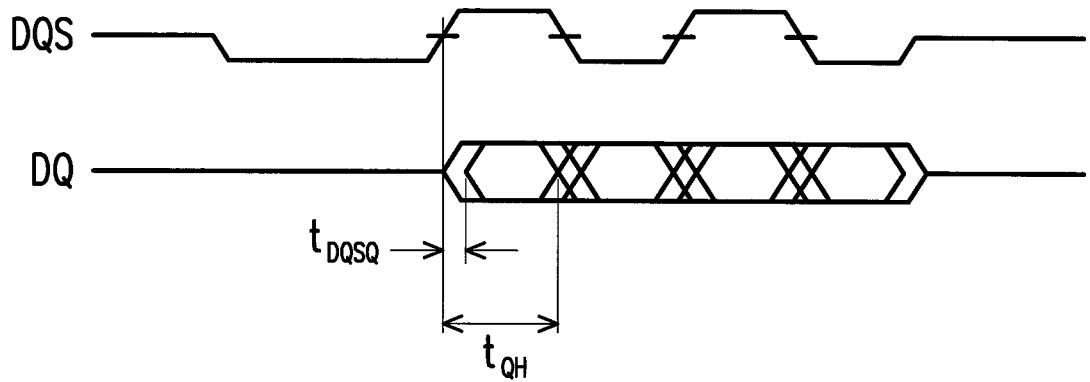
FIG. 1 is a schematic diagram illustrating DQ-DQS skew according to an embodiment of the invention.

For instance, FIG. 1 is a schematic diagram illustrating DQ-DQS skew according to an embodiment of the invention. With reference to FIG. 1, there is a skew tDQSQ between the start point of the DQS signal (i.e., the cross point of the DQS signal and the /DQS signal) and the start point of the DQ signal, and an alignment delay exists between the first valid data line and the last valid data line of the DQ signal. Such alignment delay refers to a parameter tQH. The valid data width of the DQ signal may be obtained by subtracting the skew tDQSQ from the parameter tQH. In view of the above, the maximum width of the clock signal (DQS) for testing the memory is obtained, and the data width of the data signal (DQ) is obtained by means of a central reference voltage of the data signal. The data width and the maximum width are compared with each other; if the data width exceeds the maximum width, the data may be determined to be invalid, and further the memory may be determined to be damaged.

Figure 2:
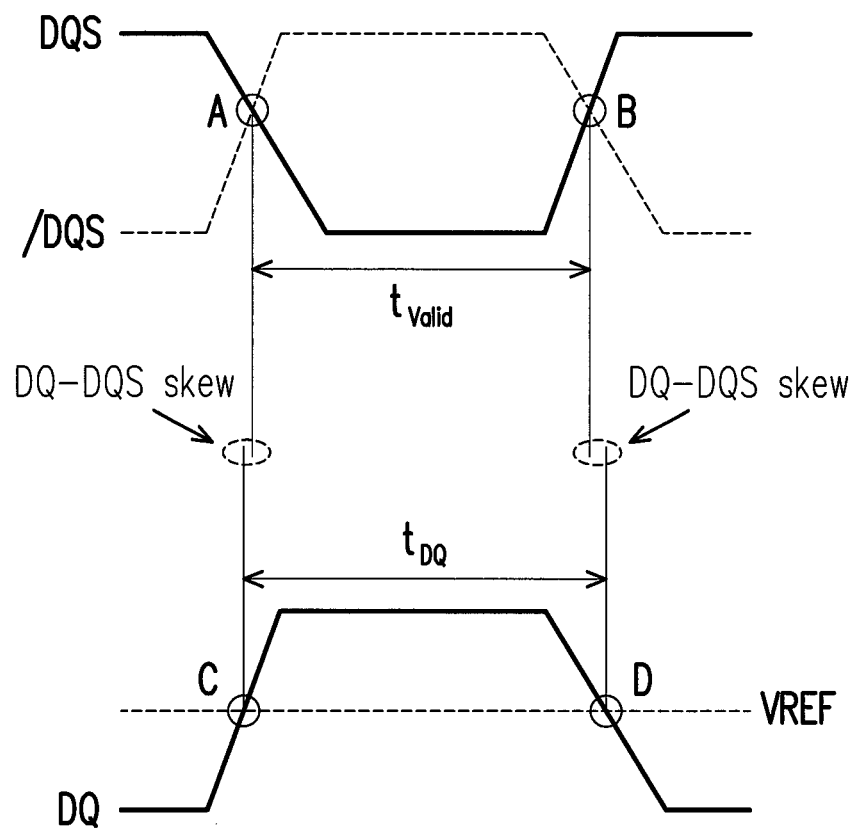
FIG. 2 is a schematic diagram illustrating a valid data width between a DQS signal and a DQ signal according to an embodiment of the invention.

FIG. 2 is a schematic diagram illustrating a valid data width between a DQS signal and a DQ signal according to an embodiment of the invention. With reference to FIG. 2, a width tValid between two cross points A and B of the DQS signal and the /DQS signal may determine the valid data width of the DQS signal. By contrast, a width tDQ between the cross points C and D between the DQ signal and the central reference voltage VREF determines the valid data width of the DQ signal. When the DQ-DQS skew between the DQS signal and the DQ signal is also taken into account, the following conclusion may be obtained: if the width tDQ exceeds the maximum width tValid and also exceeds a predetermined threshold, it can be determined that the waveform of the DQ signal is invalid, and further the memory may be determined to be damaged. The threshold is, for instance, a positive value or a negative value of the skew between the DQS signal and the DQ signal or a multiple of the positive value or the negative value, and the invention is not limited thereto.

Figure 3:
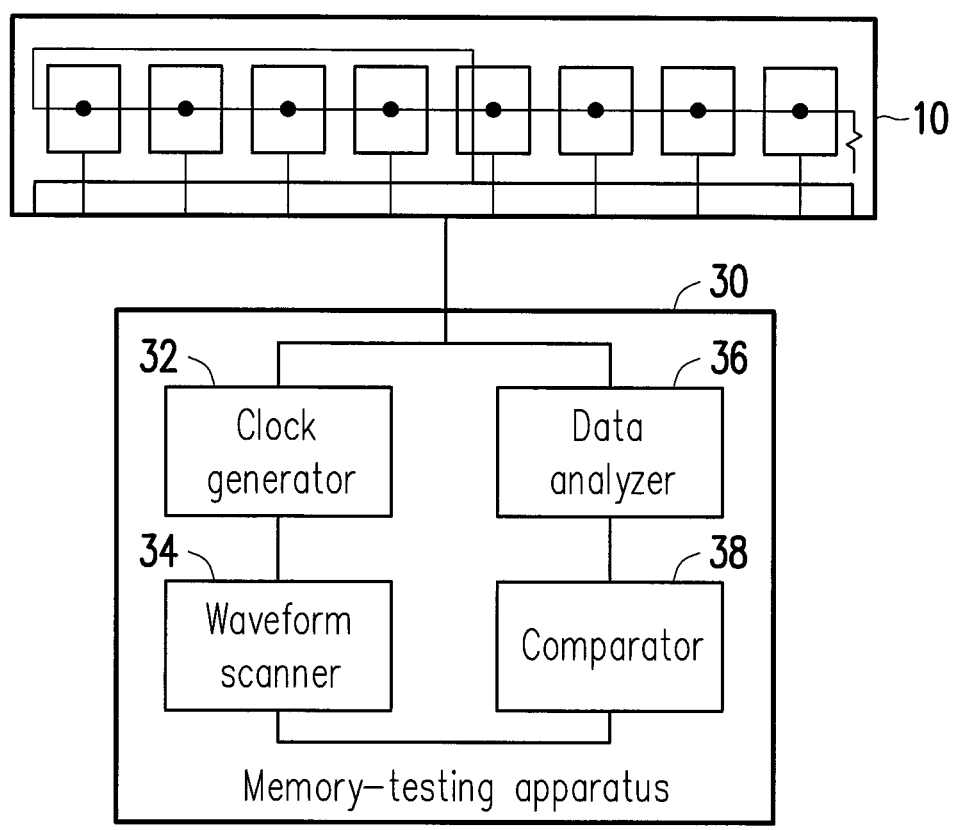
FIG. 3 is a block diagram illustrating an apparatus for testing a memory according to an embodiment of the invention.

FIG. 3 is a block diagram illustrating an apparatus for testing a memory according to an embodiment of the invention. With reference to FIG. 3, the apparatus 30 for testing a memory 10 includes a clock generator 32, a waveform scanner 34, a data analyzer 36, and a comparator 38. The clock generator 32 is coupled to the memory 10 so as to generate a clock signal (i.e., the DQS signal) for testing the memory 10. For instance, the clock generator 32 generates a differential clock signal and outputs the same to the memory 10, and a delay-locked loop (DLL) of the memory 10 may thereby generate the DQS signal. The waveform scanner 34 is coupled to the clock generator 32 and configured to determine the maximum valid data width of the clock signal. The data analyzer 36 is also coupled to the memory 10 and configured to determine the valid data width of the data signal (i.e., the DQ signal) outputted by the memory 10. The comparator 38 is respectively coupled to the waveform generator 32 and the data analyzer 36 and configured to compare the data widths respectively defined by the waveform generator 32 and the data analyzer 36, thereby determining whether or not the memory under test is damaged.

Figure 4:
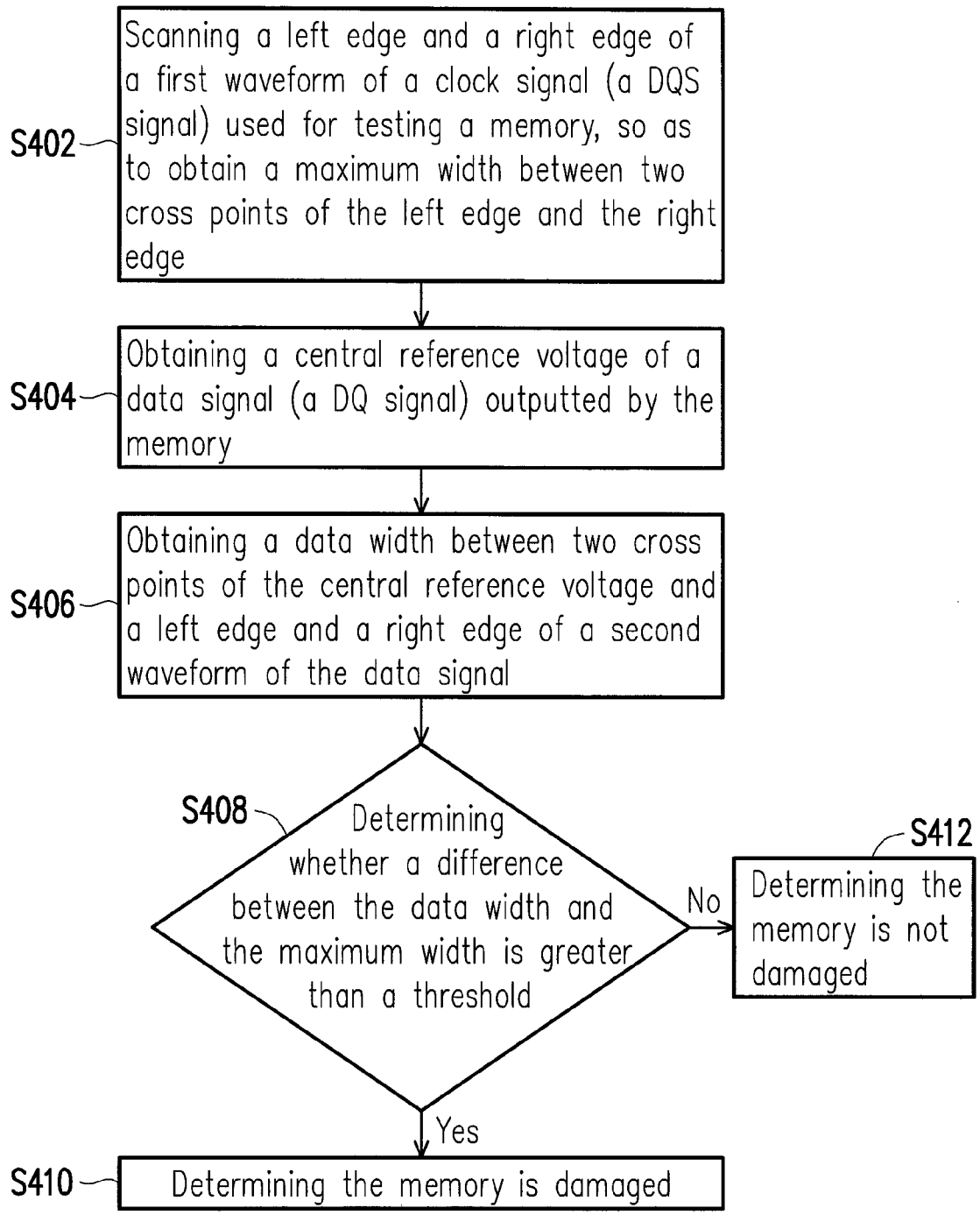
FIG. 4 is a flowchart illustrating a method for testing a memory according to an embodiment of the invention.

FIG. 4 is a flowchart illustrating a method for testing a memory according to an embodiment of the invention. With reference to FIG. 3 and FIG. 4, the method described in the present embodiment is applicable to the apparatus 30 and is adapted to be conducted when a BIOS of the electronic apparatus (having the memory 10) initializes the memory 10. The detailed process of the method is described hereinafter with reference to the components of the apparatus 30 depicted in FIG. 3.

In step S402, the waveform scanner 34 scans a left edge and a right edge of a first waveform of the clock signal (i.e., the DQS signal) of the memory 10, so as to obtain a maximum width between two cross points of the left edge and the right edge. Here, the clock signal is generated by the clock generator 32. The clock signal includes two differential signals, and the waveform scanner 34 scans the cross point of the left edges of the two differential signals and the cross point of the right edges of the two differential signals so as to obtain the desired maximum width. Besides, within a predetermined time period, the waveform scanner 34 repeatedly scans the waveforms generated by the clock generator 32 to obtain the widths of the cross points of the left and right edges of the waveforms. The maximum width among the obtained widths may serve as a basis of determining whether or not the data signal is valid. That is, the validity of the data signal is substantiated if the data signal is completely transferred within the maximum width.

In step S404, the data analyzer 36 obtains a central reference voltage of a data signal (the DQ signal) outputted by the memory 10; in step S406, the data analyzer 36 obtains a data width between two cross points of the central reference voltage and a left edge and a right edge of a second waveform of the data signal. The obtained data width may be considered as the valid data width of the data signal.

In step S408, the comparator 38 calculates a difference between the data width and the maximum width and compares the difference with a threshold to determine whether the difference is greater than the threshold. Owing to the DQS-DQ skew (as the skew tDQSQ exemplarily shown in FIG. 1), the threshold provided in the present embodiment refers to the positive value or the negative value of the skew or a multiple of the positive value or the negative value, so as to determine whether a value of the data width exceeding the maximum width is within an acceptable range.

In step S410, if the difference is greater than the threshold, the comparator 38 determines that the memory under test is damaged. On the contrary, if the difference is less than or equal to the threshold, the comparator 38 determines that the memory under test is not damaged. When calculating the difference between the data width and the maximum width, the comparator 38 may, for instance, first determine whether the data width is greater than the maximum width. If the data width is greater than the maximum width, the comparator 38 directly compares the difference between the data width and the maximum width with the threshold, so as to determine whether the difference is greater than the threshold; if the data width is less than the maximum width, the comparator 38 calculates an absolute value of the difference between the data width and the maximum width and compares the absolute value with the threshold, so as to determine whether the absolute value of the difference is greater than the threshold.

It should be mentioned that the method described in the present embodiment is adapted for testing one single memory; in another embodiment, however, the method can also be conducted to test plural memory dies in the memory. To be specific, the waveform scanner 34 and the data analyzer 36 may be sequentially coupled to the memory dies of the memory 10 and may scan each of the memory dies. After the scanning for one memory die is completed, other memory dies are subsequently scanned sequentially. After the determination for all the memory dies in a memory is completed, the memories of other channels may also be tested and determined until the determination for the memories of all channels is completed.

To sum up, according to the method and the apparatus for testing the memory provided herein, the waveform of the data signal outputted by the memory is scanned to obtain the data width, and the obtained data width is compared with the maximum width obtained in advance. Based on whether the data width exceeds the maximum width, it can be determined that the memory is damaged or not. Said test may be performed during the initialization of the memory, so as to prevent the memory from not being able to be read due to errors occurring in the memory during its initialization. Moreover, damaged memory dies in the memory may be further located by conducting the method for testing the memory as described herein, so as to lower the rate of discarding the motherboard with the on-board memory.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A method for testing a memory, adapted for an electronic apparatus to test the memory, comprising:
   scanning a left edge and a right edge of a first waveform of a clock signal for testing the memory to obtain a maximum width between two cross points of the left edge and the right edge;
   obtaining a central reference voltage of a data signal outputted by the memory;
   obtaining a data width between two cross points of the central reference voltage and a left edge and a right edge of a second waveform of the data signal;
   determining whether a difference between the data width and the maximum width is greater than a threshold; and
   when the difference is greater than the threshold, determining the memory is damaged.

2. The method as recited in claim 1, wherein the clock signal comprises two differential signals, and the step of scanning the left edge and the right edge of the first waveform of the clock signal for testing the memory to obtain the maximum width between the two cross points of the left edge and the right edge of the first waveform of the clock signal comprises:
   scanning the cross point of the left edges of the two differential signals and the cross point of the right edges of the two differential signals to obtain the maximum width between the two cross points of the left edge and the right edge of the first waveform of the clock signal.

3. The method as recited in claim 1, wherein the step of determining whether the difference between the data width and the maximum width is greater than the threshold further comprises:
   determining whether the data width is greater than the maximum width;
   if the data width is greater than the maximum width, comparing the difference between the data width and the maximum width with the threshold, so as to determine whether the difference is greater than the threshold; and
   if the data width is less than the maximum width, calculating an absolute value of the difference between the data width and the maximum width and comparing the absolute value with the threshold, so as to determine whether the absolute value of the difference is greater than the threshold.

4. The method as recited in claim 1, wherein the method is adapted to be conducted when a basic input output system of the electronic apparatus initializes the memory.

5. The method as recited in claim 1, wherein the steps of obtaining the data width between the two cross points of the central reference voltage and the left edge and the right edge of the second waveform of the data signal and determining whether the difference between the data width and the maximum width is greater than the threshold to determine whether the memory is damaged comprise:

sequentially obtaining the data width between the two cross points of the central reference voltage and the left edge and the right edge of the second waveform of the data signal outputted by each of a plurality of memory dies in the memory;

determining whether the difference between each of the data widths and the maximum width is greater than the threshold; and if the difference is greater than the threshold, determining the corresponding memory die is damaged.

6. The method as recited in claim 1, wherein the threshold is a positive value or a negative value of a skew between the clock signal and the data signal or a multiple of the positive value or the negative value.

7. An apparatus for testing a memory, comprising:

a clock generator, coupled to the memory and configured to generate a clock signal for testing the memory and output the clock signal to the memory;

a waveform scanner, coupled to the clock generator, and configured to scan a left edge and a right edge of a first waveform of the clock signal to obtain a maximum width between two cross points of the left edge and the right edge;

a data analyzer, coupled to the memory, and configured to obtain a central reference voltage of a data signal outputted by the memory and obtain a data width between two cross points of the central reference voltage and a left edge and a right edge of a second waveform of the data signal; and a comparator, coupled to the waveform scanner and the data analyzer, and configured to determine whether a difference between the data width and the maximum width is greater than a threshold and determine the memory is damaged when the difference is greater than the threshold.

8. The apparatus as recited in claim 7, wherein the clock signal comprises two differential signals, and the waveform scanner scans the cross point of the left edges of the two differential signals and the cross point of the right edges of the two differential signals to obtain the maximum width between the two cross points of the left edge and the right edge of the first waveform of the clock signal.

9. The apparatus as recited in claim 7, wherein the comparator further determines whether the data width is greater than the maximum width, if the data width is greater than the maximum width, the comparator compares the difference between the data width and the maximum width with the threshold to determine whether the difference is greater than the threshold, and if the data width is less than the maximum width, the comparator calculates an absolute value of the difference between the data width and the maximum width and compares the absolute value with the threshold to determine whether the absolute value of the difference is greater than the threshold.

10. The apparatus as recited in claim 7, wherein the apparatus tests the memory when a basic input output system of the electronic apparatus having the memory initializes the memory.

11. The apparatus as recited in claim 7, wherein the clock generator and the data analyzer are respectively coupled to a plurality of memory dies of the memory, the clock generator outputs the clock signal to each of the memory dies;

the data analyzer sequentially obtains the data width between the two cross points of the central reference voltage and the left edge and the right edge of the second waveform of the data signal outputted by each of the memory dies in the memory;

the comparator determines whether the difference between each of the data widths obtained by the data analyzer and the maximum width is greater than the threshold and determines the corresponding memory die is damaged if the difference is greater than the threshold.

12. The apparatus as recited in claim 7, wherein the threshold is a positive value or a negative value of a skew between the clock signal and the data signal or a multiple of the positive value or the negative value.

\* \* \* \* \*